United States Patent [19]

Adair

[11] Patent Number: 4,874,685
[45] Date of Patent: Oct. 17, 1989

[54] PHOTOCURABLE COMPOSITION CONTAINING A PHOTOREDUCIBLE DYE A THIOL AND AN N,N'-DIALKYLANILINE

[75] Inventor: Paul C. Adair, Springboro, Ohio

[73] Assignee: The Mead Corporation, Dayton, Ohio

[21] Appl. No.: 125,963

[22] Filed: Nov. 27, 1987

[51] Int. Cl.$^4$ .............................................. G03C 1/72
[52] U.S. Cl. ..................................... 430/138; 430/281; 430/343; 430/922; 430/921; 522/26; 522/27
[58] Field of Search ............... 430/281, 343, 922, 921, 430/138; 522/26, 27

[56] References Cited

U.S. PATENT DOCUMENTS

| | | | |
|---|---|---|---|
| 3,883,351 | 5/1975 | Lewis | 430/330 |
| 4,578,339 | 3/1986 | Adkins | 430/138 |
| 4,594,310 | 6/1986 | Nagasaka | 430/281 |
| 4,636,459 | 1/1987 | Kawamura et al. | 430/288 |
| 4,751,102 | 6/1988 | Adair et al. | 522/25 |

Primary Examiner—Paul R. Michl
Assistant Examiner—Christopher D. RoDee
Attorney, Agent, or Firm—Smith & Schnacke

[57] ABSTRACT

The present invention provide a dye-sensitized photopolymerizable composition comprising a free radical addition polymerizable material, and a photoinitiator, the photoinitiator consisting essentially of a photoreducible dye, a thiol, and an N,N'-dialkylaniline.

11 Claims, No Drawings

PHOTOCURABLE COMPOSITION CONTAINING A PHOTOREDUCIBLE DYE A THIOL AND AN N,N'-DIALKYLANILINE

BACKGROUND OF THE INVENTION

The present invention relates to novel photohardenable compositions and photosensitive materials employing the same. More particularly, it relates to free radical addition polymerizable compositions containing a photoreducible dye and a thiol as the photoinitiator.

U.S. Pat. No. 4,399,209 and 4,440,846 to The Mead Corporation describe imaging materials and processes in which images are formed through exposure controlled release of an image-forming agent from a microcapsule containing a photohardenable composition. The imaging material is image-wise exposed to actinic radiation and subjected to a uniform rupturing force such as pressure. Typically, the image-forming agent is a color precursor which is released from the microcapsule and reacts with a developer to form a visible image.

One of the problems which has been encountered in designing commercially acceptable full color imaging materials has been the relatively short wavelength band to which most photohardenable compositions are sensitive. In most cases, compositions are sensitive to ultraviolet radiation or blue light. Compositions which are sensitive to green or red light are few in number.

Full color photosensitive materials employing photohardenable microcapsules are described in U.S. application Ser. No. 339,917 and U.S. Pat. No. 4,576,891. These materials include a photosensitive layer containing three sets of photohardenable microcapsules. Each set of microcapsules is sensitive to a different band of radiation and contains a cyan, magenta or yellow image-forming agent. The absorption spectra of the initiators employed in these microcapsules are never perfectly distinct. There is always some degree of overlap in the absorption curves and, as a result, exposure conditions must be carefully controlled to avoid cross-exposure.

It would at least be desirable to extend the sensitivity of photohardenable compositions to longer wavelengths and it would be particularly desirable to extend the sensitivity of photohardenable compositions throughout the visible spectrum. By extending sensitivity deeper into the visible spectrum, the amount of overlap in the absorption spectra of the initiators can be reduced. When sensitivity is extended throughout the visible spectrum, a panchromatic system results.

Dye-sensitized photopolymerizable compositions are well known in the art. An excellent summary of them is provided by Eaton, "Dye Sensitized Photopolymerization", Advances in Photochem, Vol. 13, pgs. 427–487. Typically, dye-sensitized photopolymerizable compositions include a photoreducible or photoxidizable dye and a reducing agent or an oxidizing agent for the dye. An early example of a dye-sensitized photopolymerizable composition is provided by Oster in U.S. Pat. No. 2,875,047 which teaches a composition comprising vinyl compounds, a photoreducible dye and a reducing agent. Typical dyes include Rosebengal, Rhodamine B, Brilliant Green, and thionine. Typical reducing agents are stannous chloride, ascorbic acid, glutathione, thiourea, allyl thiourea and hydrazine. Other examples of dye sensitized compositions are provided in U.S. Pat. Nos. 3,488,269 to Allen et al.; 3,573,922 to Rust; 3,531,281 to Rust; and 3,650,927 to Livinos disclosing a combination of a photoreducible dye and a sulfone.

SUMMARY OF THE INVENTION

The present invention relates to dye-sensitized photopolymerizable compositions comprising a free radical polymerizable material such as an ethylenically unsaturated compound, a photoreducible dye, and a thiol. The dye-sensitized photopolymerizable compositions of the present invention can be used in those applications in which photopolymerizable compositions have been used previously including as photoresists, photoadhesives, and in the imaging systems described in U.S. Pat. Nos. 4,399,209; 4,440,846; and in full color panchromatic imaging systems described in U.S. application Ser. No. 339,917 filed Jan. 18, 1982.

In view of the foregoing, a further manifestation of the present invention resides in a photosensitive material comprising a support having a layer of the aforementioned dye-sensitized photopolymerizable composition on the surface thereof. Such a photosensitive material is useful in forming polymer images for use in printing or in forming printed circuits.

A further manifestation of the present invention resides in a photosensitive material comprising a support having a layer of photosensitive microcapsules on the surface thereof, the microcapsules containing an internal phase including a photohardenable composition comprising a free radical polyerizable material such as an ethylenically unsaturated compound, a photoreducible dye and a thiol.

Still another manifestation of the present invention is a full color imaging system comprising a support having a layer of photosensitive microcapsules on the surface thereof, the microcapsules comprising a first set of microcapsules having a cyan image-forming agent associated therewith, a second set of microcapsules having a magenta image-forming agent associated therewith, and a third set of microcapsules having a yellow image-forming agent associated therewith, at least one of the first, second and third sets of microcapsules containing an internal phase which includes a dye-sensitized photohardenable composition including a free radical polymerizable material, a photoreducible dye, and a thiol. In accordance with a more preferred embodiment of the invention, the first, second and third sets of microcapsules are respectively sensitive to red, green and blue light and the dye-sensitized photopolymerizable composition of the present invention is used in at least one of the first, second and third sets of microcapsules. Typically, the dye-sensitized composition of the present invention will be used in at least the red-sensitive or green-sensitive microcapsules and possibly in the red, green and blue-sensitive microcapsules.

DETAILED DESCRIPTION OF THE INVENTION

Photoreducible dyes are well known in the photographic art and theoretically any photoreducible dye should be useful in the present invention including photoreducible methine, polymethine, triarylmethane, indoline, thiazine, acridine, xanthane, oxazine and acridine dyes. However, cyanine, carbocyanine and hemicyanine dyes are particularly preferred. Representative examples of dyes useful in the present invention are 1,1,-dialkyl-3,3,3',3'-tetramethylindocarbocyanine halides and 1,1'-dialkyl-3,3,3',3'-tetramethylindodicarbocyanine halides.

Thiols useful in the present invention can be generally represented by the formula (I)

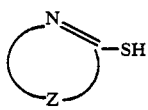

where z represents the atoms necessary to complete a 4 to 10 membered monocyclic or bicyclic heterocyclic ring such as a benzoxazole, benzimidazole, benzothiazole, tetrazole, etc.

Representative examples of thiols useful in the present invention are mercaptobenzoxazole, ethoxymercaptobenzothiazole, mercaptobenzothiazole and 1-phenyl-5-mercaptotetrazole.

Typically, the photoreducible dye is used in the photopolymerizable composition in an amount of approximately 0.05 to 0.20 parts to 100 parts ethylenically unsaturated compound. The thiol is typically used in a stoichiometric amount based upon the amount of dye present in the composition.

Free radical addition polymerizable ethylenically unsaturated compounds are well known in the art. Such compounds include monomers having one or more ethylenically unsaturated groups such as vinyl or allyl compounds or prepolymers having terminal or pendant ethylenic unsaturation. Representative examples include acrylic and methacrylic esters of polyhydric alcohols such as trimethylolpropane, pentaerythrithol, and the like: acrylate or methacrylate terminated epoxy resins, acrylate or methacrylate terminated polyesters, etc. Representative examples include ethylene glycol diacrylate, ethylene glycol dimethacrylate, trimethanolpropane triacrylate (TMPTA), pentaerythritol tetraacrylate, pentaerythritol tetramethacrylate, diepentaerythritol hydroxypentacrylate (DPHPA), hexanediol-1,6-dimethacrylate and diethyleneglycol dimethacrylate.

While the dye and thiol can be used alone as the initiator system of the photopolymerizable compositions of the present invention, film speeds tend to be quite low and oxygen inhibition is observed. It is desirable to use a compound in combination with an initiator which functions as an autoxidizer. An autoxidizer is a compound which is capable of consuming oxygen in a free radical chain process. Examples of useful autoxidizers are N,N-dialkylanilines. The autoxidizers are preferably used in the present invention in a concentration of about 0.5 to 10 parts per 100 parts ethylenically unsaturated compound.

Examples of preferred N,N-dialkylanilines are dialkylanilines substituted in one or more of the ortho-, meta-, or para-position by the following groups: methyl, ethyl, isopropyl, t-butyl, 3,4-tetramethylene, phenyl, trifluoromethyl, acetyl, ethoxycarbonyl, carboxy, carboxylate, trimethylsilylmethyl, trimethylsilyl, triethylsilyl, trimethylgermanyl, triethylgermanyl, trimethylstannyl, triethylstannyl, n-butoxy, n-pentyl, penoxy, hydroxy, acetyl-oxy, methylthio, ethylthio, isopropylthio, thio-(mercapto-), acetylthio, fluoro, chloro, bromo and iodo.

Representative examples of N,N-dialkylanilines useful in the present invention are 4-cyano-N,N-dimethylaniline, 4-acetyl-N,N-dimethylaniline, 4-bromo-N,N-dimethylaniline, ethyl 4-(N,N-dimethylamino) benzoate 3-chloro-N,N-dimethylaniline, 4-chloro-N,N-dimethylaniline, 3-ethoxy-N,N-dimethylaniline, 4-fluoro-N,N-dimethylaniline, 4-methyl-N,N-dimethylaniline, 4-ethoxy-N,N-dimethylaniline, N,N-dimethylthioanicidine, 4-amino-N,N-dimethylaniline, 3-hydroxy-N,N-dimethylaniline, N,N,N',N'-tetramethyl-1,4-dianiline, 4-acetamido-N,N-dimethylaniline, etc.

Preferred N,N-dialkylanilines are substituted with an alkyl group in the ortho-position and include 2,6-diisopropyl-N,N-dimethylaniline, 2,6-diethyl-N,N-dimethaniline, N,N,2,4,6-pentamethylaniline (PMA) and p-t-butyl-N,N-dimethylaniline.

The photohardenable compositions of the present invention can be coated upon a support in a conventional manner and used as a photoresist or in photolithography to form a polymer image; or they can be encapsulated as described in U.S. Pat. Nos. 4,399,209 and 4,440,846 and used to control the release of an image-forming agent. The latter processes typically involve image-wise exposing the photosensitive material to actinic radiation and subjecting the layer of microcapsules to a uniform rupturing force such as pressure, abrasion, or ultrasonic energy whereupon the image-forming agent is released from the microcapsules for reaction with a developer.

Several processes can be used to form color images as explained in U.S. application Ser. No. 339,917. If the microcapsules contain photosensitive compositions which are sensitive to red, green and blue light, images can be formed by direct transmission or reflection imaging or by image processing. Image processing may involve forming color separations (color-seps) corresponding to the red, green, and blue component images and sequentially exposing the photosensitive material to three distinct bands of radiation hereinafter designated $\lambda$-1, $\lambda$-2, and $\lambda$-3 through each color separation. $\lambda$-1, $\lambda$-2, and $\lambda$-3 may be red, green, and blue light. Otherwise, it may involve electronic processing in which the image or subject to be recorded is viewed through a Dunn or matrix camera and the output from the camera electronically drives three exposure sources corresponding to $\lambda$-1, $\lambda$-2, and $\lambda$-3. Alternatively, the image may be produced synthetically, e.g., a computer-generated image.

While the discussion herein relates to forming 3-color full color images, 4-color images are also possible. For example, microcapsules containing cyan, magneta, yellow, and black image-forming agents can be provided which have distinct sensitivities at four wavelengths, e.g., $\lambda$-1, $\lambda$-2, $\lambda$-3, and $\lambda$-4.

In accordance with the invention, at least one set of the microcapsules in a full color system contains a photohardenable composition in accordance with the present invention. The other sets also may contain such a composition, or they may contain a different type of photoinitiator.

In accordance with the preferred embodiments of the invention, a full color imaging system is provided in which the microcapsules are sensitive to red, green, and blue light respectively. The photosensitive composition in at least one and possibly all three microcapsules are sensitized by an ionic dye compound. For optimum color balance, the microcapsules are sensitive ($\lambda$max) at about 450 nm, 550 nm, and 650 mn, respectively. Such a system is useful with visible light sources in direct transmission or reflection imaging. Such a material is useful in making contact prints or projected prints of color photographic slides. They are also useful in electronic imaging using lasers or pencil light sources of appropriate wavelengths.

Because the ionic dye compounds absorb at wavelengths greater than 400 nm, they are colored. Typically, the unexposed dye compound is present with the image-forming agent in the image areas and, thus, the color of the compound must be considered in determining the color of the image. However, the compound is used in very small amounts compared to the image-forming agent and exposure sometimes bleaches the compound.

The photohardenable compositions of the present invention can be encapsulated in various wall formers using techniques known in the area of carbonless paper including coacervation, interfacial polymerization, polymerization of one or more monomers in an oil, as well as various melting, dispersing, and cooling methods. To achieve maximum sensitivities, it is important that an encapsulation technique be used which provides high quality capsules which are responsive to changes in the internal phase viscosity in terms of their ability to rupture.

Oil soluble materials have been encapsulated in hydrophilic wall-forming materials such as gelatin-type materials (see U.S. Pat. Nos. 2,730,456 and 2,800,457 to Green et al.) including gum arabic, polyvinyl alcohol, carboxy-methylcellulose; resorcinol-formaldehyde wall-formers (see U.S. Pat. No. 3,755,190 to Hart, et al.); isocyanate wall-formers (see U.S. Pat. No. 3,914,511 to Vassiliades); isocyanate-polyol wall-formers (see U.S. Pat. No. 3,796,669 to Kirintani et al.); urea-formaldehyde wall-formers, particularly urea-resorcinol-formaldehyde in which oleophilicity is enhanced by the addition of resorcinol (see U.S. Pat. Nos. 4,001,140; 4,087,376 and 4,089,802 to Foris et al.); melamine-formaldehyde resin; hydroxypropyl cellulose (see commonly assigned U.S. Pat. No. 4,025,455 to Shackle); and UF capsules formed using pectin as a system modifier as discussed in U.S. Pat. 4,608,330 to Marabella.

Urea-resorcinol-formaldehyde and melamine-formaldehyde capsules with low oxygen permeability are preferred.

A capsule size should be selected which minimizes light attenuation. The mean diameter of the capsules used in this invention typically ranges from approximately 1 to 25 microns. As a general rule, image resolution improves as the capsule size decreases. If the capsules become too small, they may become inaccessible in the pores or the fiber of the substrate. These very small capsules may therefore be screened from exposure by the substrate. They may also fail to rupture when exposed to pressure or other rupturing means. In view of these problems, it has been determined that a preferred mean capsule diameter range is from approximately 5 to 10 microns. Technically, however, the capsules can range in size up to the point where they become visible to the human eye.

An open phase system may also be used in accordance with the invention instead of an encapsulated one. This can be done by dispersing what would otherwise be the capsule contents throughout a binder on the substrate as discrete droplets. Suitable coatings for this embodiment include polymer binders whose viscosity has been adjusted to match the dispersion required in the coating. Suitable binders are gelatin, polyvinyl alcohol, polyacrylamide, and acrylic lattices. Whenever reference is made to "capsules" and "encapsulation" without reference to a discrete capsule wall in this specification or the appended claims, those terms are intended to include the alternative of an open phase system.

The photosensitive material of the present invention can be used to control the interaction of various image-forming agents.

In one embodiment of the present invention the capsules may contain a benign visible dye in the internal phase in which case images are formed by contacting the exposed imaging material under pressure with a plain paper or a paper treated to enhance its affinity for the visible dye. A benign dye is a colored dye which does not interfere with the imaging photochemistry, for example, by relaxing the excited state of the initiator or detrimentally absorbing or attenuating the exposure radiation.

In a preferred embodiment of the invention, images are formed through the reaction of a pair of chromogenic materials such as a color precursor and a color developer, either of which may be encapsulated with the photohardenable composition and function as the image forming agent. In general, these materials include colorless electron donating type compounds and are well known in the art. Representative examples of such color formers include substantially colorless compounds having in their partial skeleton a lactone, a lactam, a sultone, a spiropyran, an ester or an amido structure such as triarylmethane compounds, bisphenylmethane compounds, xanthene compounds, fluorans, thiazine compounds, spiropyran compounds and the like. Crystal Violet Lactone and Copikem X, IV and XI (products of Hilton-Davis Chemical Co., Cincinnati, Ohio), React Yellow (a product of BASF) are often used. The color formers can be used alone or in combination.

The developer materials conventionally employed in carbonless paper technology are also useful in the present invention. Illustrative examples are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts or aromatic carboxylic acids such as zinc salicylate, tin salicylate, zinc 2-hydroxy naphthoate, zinc 3,5 di-tert butyl salicylate, zinc 3,5-di-(O-methylbenzyl)salicylate, oil soluble metal salts or phenol-formaldehyde novolak resins (e.g., see U.S. Pat. Nos. 3,672,935; 3,732,120 and 3,737,410) such as zinc modified oil soluble phenol-formaldehyde resin as disclosed in U.S. Pat. No. 3,732,120, zinc carbonate etc. and mixtures thereof. A particularly useful developer is described in U.S. application Ser. No. 905,272 filed September 9, 1986.

As indicated in U.S. Pat. 4,399,209 and 4,440,846, the developer may be present on the photo sensitive sheet (providing a so-called self-contained system) or on a separate developer sheet.

In self-contained systems, the developer may be provided in a single layer underlying the microcapsules as disclosed in U.S. Pat. No. 4,440,846. Alternatively, the color former and the color developer may be individually encapsulated in photosensitive capsules and upon exposure both capsule sets image-wise rupture releasing color former and developer which mix to form the image. Alternatively, the developer can be encapsulated in non-photosensitive capsules such that upon processing all developer capsules rupture and release developer but the color former containing capsules rupture in only the unexposed or under-exposed area which are the only areas where the color former and developer mix. Still another alternative is to encapsulate the developer in photosensitive capsules and the color former in non-photosensitive capsules.

The present invention is not necessarily limited to embodiments where the image-forming agent is present in the internal phase. Rather, this agent may be present in the capsule wall of a discrete capsule or in the binder of an open phase system or in a binder or coating used in combination with discrete capsules or an open phase system designed such that the image-wise ruptured capsules release a solvent for the image-forming agent. Embodiments are also envisioned in which a dye or chromogenic material is fixed in a capsule wall or binder and is released by interaction with the internal phase upon rupturing the capsules.

The most common substrate for the microencapsulated imaging material is a transparent film since it assists in obtaining uniform development characteristics, however, paper may also be used. Another preferred substrate is a reflective substrate such as metallized polymeric films like aluminized PET. The paper may be a commercial impact raw stock, or special grade paper such as cast-coated paper or chrome-rolled paper. Transparent films such as polyethylene terephthalate can be used. Translucent substrates can also be used in this invention. Conventional printing plate supports can be used in printing applications.

The present invention is illustrated in more detail by the following non-limiting examples:

To illustrate this initiator system, a series of "slide tests" were conducted as below:

A stock solution was made which consisted of 400 g TMPTA and 0.80 g of 1,1'-dibutyl-3,3,3',3'-tetramethylindomethylindocarbocyanine iodine to 10 g portions of this stock was added 0.4 g of a number of potentially efficient quenching agents. The resultant solution was then stirred at 60° C. until the quencher was dissolved. After the solution was cooled, a drop was placed between two glass microscope slides. A light source (consisting of one 15 Watt F15T8-D G.E. Daylight tube six inches from the sample with a 0.3 Wratten neutral density filter placed between the light source and sample) was used to expose the sandwiched photo sensitive composition. The times required for first noticable polymerization and for total slide immobilization were noted.

| THIOL | AVERAGE TIME (sec.) | |
|---|---|---|
| | FIRST POLYMERIZATION | IMMOBILIZATION |
| 2-Mercaptobenzoxazole | 41 | 44 |
| 1-Phenyl-5-Mercaptotetrazole | 35 | 37 |
| No added Thiol | >60 | >60 |

In a second round of tests, a known efficient autooxidant, N,N,2,4,6-pentamethylaniline, was added to each of the above three solutions. This addition greatly enhanced the polymerization rate, as shown below:

| THIOL | AVERAGE TIME (sec.) | |
|---|---|---|
| | FIRST POLYMERIZATION | IMMOBILIZATION |
| 2-mercaptobenzoxazole | 13 | 15 |
| 1-phenyl-5-mercaptotetrazole | 10 | 11 |
| No added Thiol | >60 | >60 |

What is claimed is:

1. A dye-sensitized photopolymerizable composition comprising a free radical addition polymerizable material, and a photoinitiator, said photoinitiator consisting essentially of a photoreducible dye, a thiol and an N,N'-dialkylaniline.

2. The dye-sensitized photopolymerizable composition of claim 1 wherein said free radical addition polymerizable material is an ethylenically unsaturated compound.

3. The dye-sensitized photopolymerizable composition of claim 1 wherein said photoreducible dye is selected the group consisting of photoreducible methine, polymethine, triarylmethane, indoline, thiazine, acridine, xanthene, oxazine, acridine, cyanine, carbocyanine and hemicyanine dyes.

4. The dye-sensitized photopolymerizable composition of claim 1 wherein said photoreducible dye is a cyanine dye.

5. The dye sensitized photopolymerizable composition of claim 1 wherein said cyanine dye is a methine or polymethine dye.

6. The dye-sensitized photopolymerizable composition of claim 1 wherein said thiol is a hetercyclic thiol.

7. A photosensitive material comprising a support having a layer of dye-sensitized photopolymerizable composition on the surface thereof, said composition comprising a free radical addition polymerizable or crosslinkable material, and a photoinitiator, said photoinitiator consisting essentially of a photoreducible dye, a thiol and an N,N'-dialkylaniline.

8. A photosensitive material comprising a support having a layer of microcapsules on one surface thereof, said microcapsules having an image-forming agent associated therewith and containing an internal phase including a dye-sensitized photopolymerizable composition, said composition comprising a free radical addition polymerizable or crosslinkable compound, and a photoinitiator, said photoinitiator consisting essentially of a photoreducible dye, a thiol and an N,N'-dialkylaniline.

9. The composition according to claim 1 wherein said photoinitiator is capable of initiating polymerization of said polymerizable material upon exposure to visible light.

10. The material according to claim 7 wherein said photoinitiator is capable of initiating polymerization of said polymerizable material upon exposure to visible light.

11. The material according to claim 8 wherein said photoinitiator is capable of initiating polymerization of said polymerizable material upon exposure to visible light.

* * * * *